(12) United States Patent
Nagashima et al.

(10) Patent No.: US 9,145,621 B2
(45) Date of Patent: Sep. 29, 2015

(54) PRODUCTION METHOD OF AN ALUMINUM BASED GROUP III NITRIDE SINGLE CRYSTAL

(75) Inventors: Toru Nagashima, Ibaraki (JP);
Keiichiro Hironaka, Ibaraki (JP)

(73) Assignee: Tokuyama Corporation, Yamaguchi (JP)

( * ) Notice: Subject to any disclaimer, the term of this patent is extended or adjusted under 35 U.S.C. 154(b) by 261 days.

(21) Appl. No.: 13/820,530

(22) PCT Filed: Dec. 15, 2011

(86) PCT No.: PCT/JP2011/079060
§ 371 (c)(1),
(2), (4) Date: Mar. 4, 2013

(87) PCT Pub. No.: WO2012/081670
PCT Pub. Date: Jun. 21, 2012

(65) Prior Publication Data
US 2013/0319320 A1    Dec. 5, 2013

(30) Foreign Application Priority Data

Dec. 15, 2010    (JP) ................................. 2010-278825

(51) Int. Cl.
*C30B 29/38* (2006.01)
*C30B 25/10* (2006.01)
(Continued)

(52) U.S. Cl.
CPC . *C30B 25/10* (2013.01); *C01F 7/56* (2013.01); *C01F 7/58* (2013.01); *C30B 25/00* (2013.01);
(Continued)

(58) Field of Classification Search
CPC ........ C30B 25/02; C30B 25/14; C30B 29/38; H01L 21/20
See application file for complete search history.

(56) References Cited

U.S. PATENT DOCUMENTS

2008/0083970 A1    4/2008  Kamber et al.
2010/0029065 A1*   2/2010  Nagashima et al. .......... 438/478
(Continued)

FOREIGN PATENT DOCUMENTS

| JP | 49-042599 B1 | 11/1974 |
| JP | 2003-303774 A | 10/2003 |
| JP | 2007-042854 A | 2/2007 |

OTHER PUBLICATIONS

International Application No. PCT/JP2011/079060 Translation of International Preliminary Report on patentability and Written Opinion dated Jun. 27, 2013.

(Continued)

*Primary Examiner* — Robert M Kunemund
(74) *Attorney, Agent, or Firm* — Cahn & Samuels, LLP

(57) ABSTRACT

A production method of aluminum based group III nitride single crystal includes a reaction step, wherein a halogenated gas and an aluminum contact at 300° C. or more to 700° C. or less, producing a mixed gas including an aluminum trihalide gas and an aluminum monohalide gas; a converting step, wherein the aluminum monohalide gas is converted to a solid by setting a temperature of the mixed gas equal to or higher than a temperature to which a solid aluminum trihalide deposit, and lower by 50° C. or more than a temperature to which halogenated gas and aluminum contact in the reaction step; a separation step, wherein the aluminum trihalide gas is removed; and a crystal growth step, wherein the aluminum trihalide gas is used for an aluminum based group III nitride single crystal raw material, keeping its temperature equal to or higher than a temperature of the converting step.

9 Claims, 2 Drawing Sheets

(51) Int. Cl.
*C30B 29/40* (2006.01)
*C01F 7/56* (2006.01)
*C01F 7/58* (2006.01)
*C30B 25/00* (2006.01)
*C30B 35/00* (2006.01)
*H01L 21/02* (2006.01)

(52) U.S. Cl.
CPC ............. *C30B 29/403* (2013.01); *C30B 35/007* (2013.01); *H01L 21/0254* (2013.01); *H01L 21/0262* (2013.01)

(56) References Cited

U.S. PATENT DOCUMENTS

2012/0295418 A1* 11/2012 Melnik et al. ................. 438/478
2013/0320353 A1* 12/2013 Kryiouk et al. ................ 257/76

OTHER PUBLICATIONS

International Application No. PCT/JP2011/079060 Translation of International Search Report dated Jun. 12, 2012.

* cited by examiner

PRODUCTION METHOD OF AN ALUMINUM BASED GROUP III NITRIDE SINGLE CRYSTAL

This application is a U.S. national stage application of PCT international application PCT/JP2011/079060 filed on 15 Dec. 2011 which claims priority of Japanese patent document 2010-278825 filed on 15 Dec. 2010, the entireties of which are incorporated herein by reference.

TECHNICAL FIELD

The present invention relates to a novel production method of an aluminum based group III nitride single crystal. In particular, it relates to a production method of an aluminum based group III nitride single crystal by using aluminum trihalide, in which content of aluminum monohalide gas is reduced.

BACKGROUND OF THE INVENTION

III nitride single crystal, such as aluminum nitride and gallium nitride, has large bandgap energy. Bandgap energy of aluminum nitride is around 6.2 eV, and that of gallium nitride is around 3.4 eV. Bandgap energy of aluminum gallium nitride, a mixed crystal thereof, is between bandgap energy of aluminum nitride and that of gallium nitride according to its component fraction.

Therefore, emission of short-wavelength light in ultraviolet region, which is impossible with the other semiconductor, becomes possible with said aluminum based group III nitride single crystal. And it becomes possible to manufacture light emitting sources such as an ultraviolet-emitting diode for white light source, a disinfectant ultraviolet-emitting diode, a laser available for reading and writing high-density optical disk memory and communication laser. In addition, it can be applied to electronic devices such as ultrafast electron-transfer transistor taking advantage of high saturated drift velocity of electron, and to field emitter taking advantage of negative electron affinity.

For device parts, function as light emitting source, electronic device and the like, it is generally tested to form a multilayered structure wherein thin films thinner than several micrometers are layered on a substrate. These are formed by a well-known crystal growing methods, such as Molecular Beam Epitaxy (MBE) method, Metalorganic Vapor Phase Epitaxy (MOVPE) method and Hydride Vapor Phase Epitaxy (HVPE) method.

As for a substrate forming the above multilayered structure, particularly a multilayered structure which become light-emitting element, a single crystal substrate comprising the above aluminum based group III nitride (Al III nitride, hereinafter), particularly aluminum nitride, is preferable. This is because an influence of lattice mismatch on boundary face or of stress generated by a temperature history when growing can be kept to the minimum, when a single crystal of III nitride, such as aluminum nitride, gallium nitride and the like, or mixed crystals thereof are formed as a growth layer. As a result, it is considered that dislocation density, deficiency and crack in growth layer will be decreased; and emission efficiency will be improved as well. Further, in case when growing ultraviolet-emitting layer, bandgap energy of a substrate part becomes larger than that of emitting layer when Al III nitride single crystal is used as a substrate; accordingly, emitted ultraviolet light will not be absorbed to the substrate and that efficiency of taking out the light will be increased.

Considering manufacturing method of the above Al III nitride single crystal substrate, the present inventors have already proposed a manufacturing method using HVPE method (Patent Articles 1 and Patent Article 2). Said HVPE method is a method wherein III group source gas of III halide gas, such as aluminum trichloride, and nitrogen source gas, such as ammonia, contact a single crystal substrate which is held at an elevated temperature; and then III nitride is epitaxially grown on the single crystal substrate. The method has a feature that crystal growth rate is fast. Accordingly, Al III nitride single crystal can be churned out at a practical level. Therefore, by processing the thick film single crystal obtained on a substrate, such as sapphire, to a wafer-state with the above method, it can be used as an Al III nitride single crystal substrate. Further, by forming multilayered structure on such substrate by a crystal growth method, such as MOVPE method, MBE method and HVPE method, aimed at emission and the like, it is expected that light emitting source is obtainable with high efficiency.

As mentioned above, use of Al III nitride single crystal substrate allow for higher performance and higher quality of growth layer when manufacturing a multilayered structure functional for emission, electron transfer and the like.

Two types of the following devices are conventionally known as a HVPE device for manufacturing a thick-film Al III nitride single crystal. The first type of the device is an integrated type device described in such as Patent Article 1 wherein III group source gas generation part, where Al III halide gas is generated, and a reacting zone, where III group source gas (III group halide) and nitrogen source gas are reacted to grow Al III nitride single crystal on a single crystal substrate, are set in quartz reactor body.

The second type of the device is a separable type device to which a III group source gas generating part is set outside a reactor vessel body, comprising a reacting zone where Al III nitride single crystal is grown on a single crystal substrate; and III group source gas, generated at said III group source gas generating part, is introduced to the reactor vessel body via a pipe. According to the separable type device disclosed in Patent Article 2, III group source gas is made contact with metal aluminum before it is introduced to a reacting zone, removing oxygen impurity.

PRIOR ART

[Patent Article 1] Japanese Laid-Open Patent Publication No. 2003-303774
[Patent Article 2] Japanese Laid-Open Patent Publication No. 2007-42854

SUMMARY OF INVENTION

Said integrated device contains the III group source gas generating part in quartz reactor vessel body; and that there are problems such as a large-size quartz reaction tube is required for a reactor vessel body, maintenance inside the reactor vessel body become difficult, and device composition become complicated.

Further, according to consideration of the present inventors, when aluminum trihalide gas production method described in Patent Article 1 was merely used, and said production device and single crystal growth device were connected at a transport part, it was confirmed that adhesion substances in a powdery state generate at the transport part. When these adhesion substances were transported to the single crystal growth device together with aluminum trihalide gas, it may provide bad influence on aluminum based group III nitride single crystal production. Growth of the single crystal is a sensitive reaction; and that it was necessary at least not to mix impurities. Therefore, it was necessary to reduce adhesion substances in a powdery state, adhered to the transport part.

Present inventors have studied in detail, in order to solve the above problems. Then, they have analyzed adhesion substance at the transport part and found that solid aluminum is included in said adhesion substance. Next, a cause of the solid aluminum generation was investigated; and considered that an exposure of aluminum trihalide gas to a temperature lower than its production temperature is the cause. Namely, when aluminum and halogenated gas are made contact at a temperature lower than 700° C. or less, production rate of aluminum trihalide gas increases while it inevitably becomes a mixed gas including aluminum monohalide gas.

Further, when the mixed gas is transported from the production device, a temperature of the mixed gas once decreases, and thus it was assumed that aluminum monohalide gas included in mixed gas become solid or become adhesion substance when converted to solid aluminum. Note that, a temperature of the above mixed gas does not decrease and that a powdery state is considered not to generate, when the integrated device described in Patent Article 1 is used.

Present inventors have studied in detail on a method removing such adhesion substances. As a result, the inventors have found that when temperature of the produced aluminum trihalide gas is once purposely lowered, and aluminum monohalide gas contained is positively converted to a solid substance and separated, a content of monohalide to be a solid raw material will be decreased, and production of solid (adhesion substance) will be avoided unless its temperature is further lowered; which lead to a completion of the invention.

Namely, the present invention relates to a production method of aluminum based group III nitride single crystal comprising a reaction step, wherein a halogenated gas and an aluminum are made contact at a temperature of 300° C. or more to 700° C. or less, and a mixed gas including an aluminum trihalide gas and an aluminum monohalide gas is produced, a converting step, wherein the aluminum monohalide gas in the mixed gas is converted to a solid substance by setting a temperature of the mixed gas equal to or higher than a temperature to which a solid aluminum trihalide deposit, and lower by 50° C. or more than a temperature to which the halogenated gas and the aluminum contact in the reaction step, a separation step, wherein the aluminum trihalide gas is taken out by separating the solid substance and the gas, and a crystal growth step, wherein the aluminum trihalide gas is used for a raw material of aluminum based group III nitride single crystal without lowering its temperature and keeping the temperature equal to or higher than a temperature of the converting step.

According to the present invention, a temperature of the mixed gas in the production method is preferably set at 150° C. or more to 400° C. or less, in order to sufficiently reduce aluminum monohalide gas. Further, for a good operability, the above-identified reaction step, converting step, and separation step are preferably conducted under a flow of a hydrogen gas or an inert gas; and hydrogen chloride is preferably used as the halogenated gas.

According to the present invention, in order to positively separate solid aluminum, a solid aluminum in the separation step is preferably trapped to filler and separated. In case when such method is conducted for the separation, residual amount of aluminum monohalide gas, which is not converted to aluminum, can be reduced.

Further, according to the present invention, aluminum trihalide gas is preferably separated during the separation step at a temperature equal to or higher than a temperature of the converting step, in order to prevent solid aluminum deposition.

Further, by conducting the converting step in the presence of solid aluminum, even when unreacted halogenated gas is emitted for the reaction step, said halogenated gas and aluminum react and aluminum trihalide gas can be efficiently produced.

According to the present invention, aluminum based group III nitride single crystal can be manufactured by using aluminum trihalide gas in which content of aluminum monohalide gas is reduced. Accordingly, aluminum monohalide gas will hardly be converted to a solid substance, such as aluminum, even when it is not continuously heated to a reaction temperature or more of manufacturing aluminum trihalide gas; while deposition amount of the solid substance is few even when cooled to the reaction temperature or less. Therefore, aluminum trihalide gas can be effectively used even when a manufacturing device of aluminum trihalide gas and a reaction device using the aluminum trihalide gas are not unified.

DETAILED DESCRIPTION OF THE INVENTION

Present invention relates to a manufacturing method of aluminum based group III nitride single crystal by using aluminum trihalide gas, which can be obtained by a contact of halogenated gas and aluminum. The method comprises a reaction step wherein halogenated gas and aluminum contact at a temperature of 300° C. or more and 700° C. or less, and then a mixed gas of aluminum trihalide gas and aluminum monohalide gas is produced, a converting step wherein aluminum monohalide in the mixed gas converts to a solid substance by setting a temperature of the mixed gas to equal to or higher than a temperature at which aluminum trihalide in a solid state deposit, and to lower by 50° C. or more than a temperature at which halogenated gas and aluminum contact in the reaction step, a separation step wherein aluminum trihalide gas is removed by separating the solid substance and gas and a crystal growth step wherein the aluminum trihalide gas is used as a raw material of aluminum based group III nitride single crystal without lowering its temperature and keeping the temperature equal to or higher than that of the converting step.

According to a method of the present invention, the device for manufacturing aluminum trihalide gas is not particularly limited as long as it can conduct the reaction which meets the requirements above. Hereinafter, an example of the device is described refereeing to FIG. 1.

Figure 1:
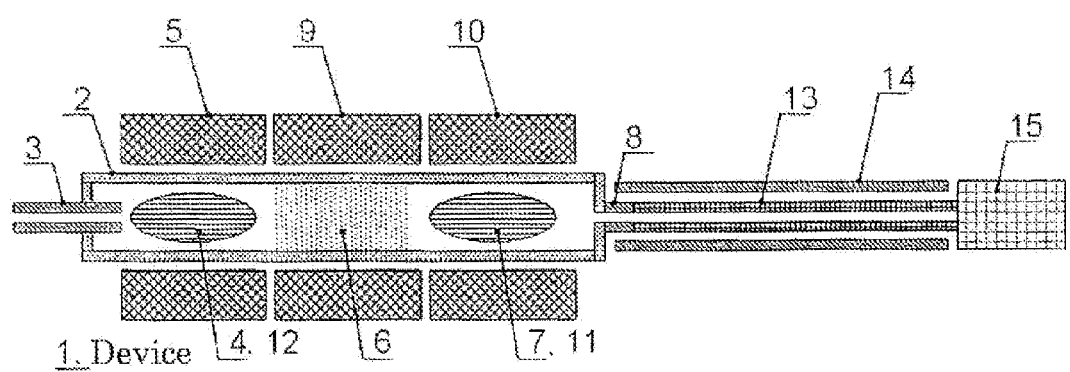
FIG. 1 is a schematic view showing a device manufacturing aluminum trihalide gas according to the present invention.

For example, device 1 of FIG. 1 comprises a reaction tube 2 of silica glass, a gas supply nozzle 3 supplying halogenated gas at upstream of reaction tube 2, a raw material placement part 4 placing aluminum of raw material in reaction tube 2 (Contact area of aluminum and halogenated gas in said raw material placement part 4 become reaction part 12.), an external heating means 5 heating raw material placement part 4 to a temperature of 300° C. or more to 700° C. or less, a convert part 6 converting aluminum monohalide gas to a solid aluminum by lowering a temperature of a mixed gas including aluminum monohalide gas and aluminum trihalide gas, obtained by a contact of halogenated gas and aluminum, a separation part 7 separating the solid aluminum, converted at convert part 6, and a gas, and exhaust nozzle 8 taking out aluminum trihalide gas obtained at separation part 7.

Further, in order to set a temperature of convert part 6 equal to or higher than a temperature to which a solid aluminum trihalide deposit and lower than a temperature to which halogenated gas and aluminum contact, external temperature regulation means 9 can be mounted at outer periphery of reaction tube 2 at said convert part 6. In addition, in order to set a temperature of separation part 7 equal to or higher than that of convert part 6, external heating means 10 can be mounted at outer periphery of reaction tube 2 at separation part 7. Filler 11 may further be placed at separation part 7, in order to securely separate solid aluminum and aluminum trihalide gas.

Method of the present invention can be performed by device 1 described above. Next, the present invention will be described in detail referring to FIG. 1.

(Reaction Step: Reaction at Reaction Part 12)

First, according to the present invention, a reaction step, wherein halogenated gas and aluminum contact at a temperature of 300° C. or more to 700° C. or less to produce a mixed gas including aluminum trihalide gas and aluminum monohalide gas, is conducted.

Halogenated gas supplied is supplied from gas supply nozzle 3, placed on upstream side of reaction tube 2. Gases producing aluminum trihalide gas by reacting with aluminum can be used for such halogenated gas. In concrete, chlorine gas, bromine gas, hydrogen chloride gas and hydrogen bromine gas are exemplified. Above all, hydrogen chloride gas is preferable, considering wider range of use of obtained aluminum trihalide gas, corrosion-inhibiting property of pipes, general versatility and economic efficiency. Note that aluminum trichloride gas and aluminum monochloride gas will be produced when hydrogen chloride is used.

Halogenated gas can be supplied alone. However, in order to promptly transport halide aluminum gas, produced from reaction of aluminum and halogenated gas, to outside of reaction part 12, hydrogen gases or inert gases are preferably used for carrier gas. In particular, according to the present invention, halogenated gas diluted in said carrier gas is preferably supplied from gas supply nozzle 3. As for the inert gas, nitrogen gas and argon gas are exemplified. As for the carrier gas, one kind of gas can be used and 2 or more kinds can be mixed and used. In particular, when produced aluminum trihalide gas is used for a raw material of aluminum based group III nitride single crystal, hydrogen gas and nitrogen gas are preferably used on the point that they do not have an adverse effect on manufacturing the single crystal. Carrier gas flow volume supplied to reaction part 12 can be determined according to volume of reactor vessel; however, flow volume of said carrier gas is within a range of 50 to 10000 sccm, more preferably, 100 to 5000 sccm.

Supplied amount of halogenated gas can be suitably determined according to outline of device, amount of the used aluminum, and the like. In concrete, practical concentration can be selected from a range of 0.0000001 vol % or more to 100 vol % or less, for supplying gas. As long as producing only halide aluminum gas is the object, it is not necessary to dilute halogenated gas with carrier gas. However, it is preferable to dilute with carrier gas when obtained aluminum trihalide gas is used for a raw material of aluminum based group III nitride single crystal. In this case, it is particularly preferable when supplied amount of halogenated gas is within a range of 0.0001 vol % or more to 0.01 vol % or less. In this case, supplied amount of halogenated gas is equivalent to 0.005 to 100 sccm.

Aluminum, which contact with said halogenated gas, is placed at raw material placement part 4 of reaction tube 2. Aluminum, placed at said raw material placement part 4, contact with halogenated gas supplied from upstream, and produces a mixed gas including aluminum trihalide gas.

According to the present invention, aluminum of a solid state having 99.9% or more of purity is preferably used for the raw material. In case when the obtained aluminum trihalide gas is used for a raw material of aluminum based group III nitride single crystal, a solid state having higher purity of 99.99% or more is preferably used. As a matter of course, the most preferable purity of aluminum is 100%. Note that, although aluminum in liquid form can be used according to a contact temperature of aluminum and halogenated gas, aluminum in solid form is preferable when contact efficiency with halogenated gas is considered. When aluminum in solid form is used, although its size is not particularly limited, when contact efficiency with halogenated gas, flow rate of the halogenated gas, pressure loss of the device and the like are considered in a practically used device, an aluminum having diameter of 0.1 mm or more and 10 mm or less, length of 0.1 mm or more to 10 mm or less and cylindroid form or similar columnar form is preferably used.

A boat can be used for storing aluminum when placing the aluminum at raw material placement part 4. An example of the boat shape is a half-cylindrical container; and the aluminum can be placed on the container. Material of the boat can be silica glass, oxidized aluminum and the like with less impurity; and can be a material having heat resistance at a temperature of 700° C. or less, to which the present example is conducted. Naturally, the present invention can be performed by directly filling aluminum inside of reaction tube 2, and not placing aluminum in the boat.

Aluminum placed at raw material placement part 4 is heated to a temperature of 300° C. or more to 700° C. or less by external heating means 5. Therefore, aluminum, placed at this raw material placement part 4 and heated to a temperature of 300° C. or more to 700° C. or less, contact with halogenated gas at reaction part 12. External heating means 5 is not particularly limited, and materials using resistance heating method, light heating method, high-frequency induction heating method and the like can be used.

Figure 2:
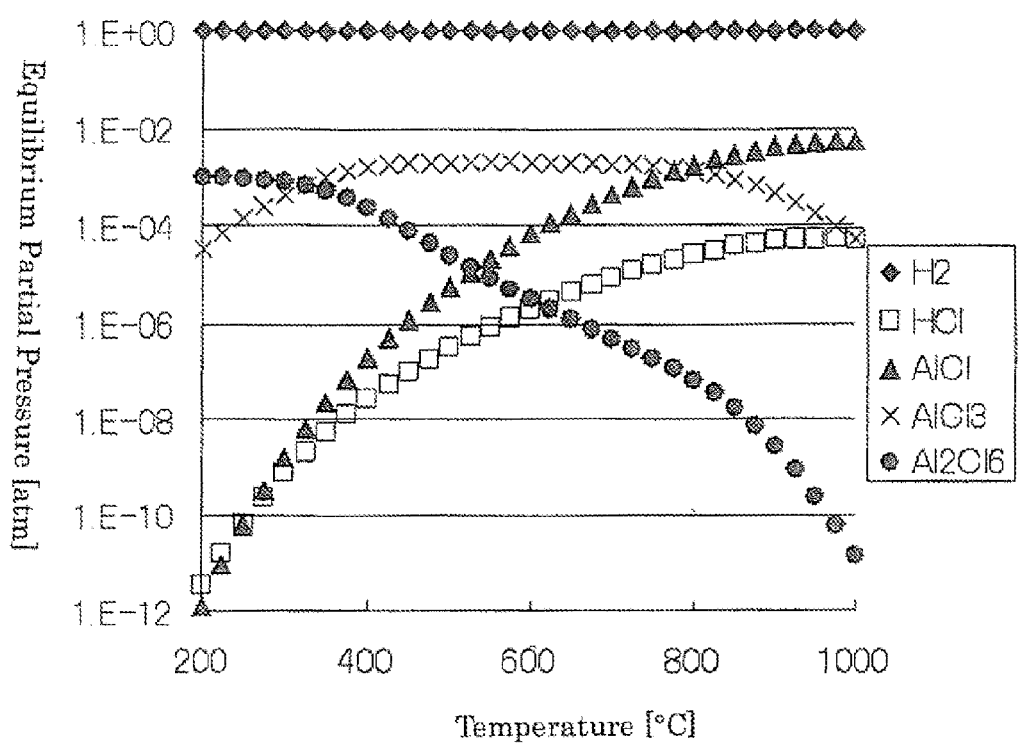
FIG. 2 is a graph showing a relation between an equilibrium partial pressure, produced by a reaction of aluminum and hydrogen chloride, and a temperature.

Aluminum is heated to a temperature of 300° C. or more to 700° C. or less (Hereinafter, this temperature is merely referred to as a reaction temperature in some cases.) at reaction part 12. Patent Article 1 shows that more aluminum trihalide gas is produced than aluminum monohalide gas by conducting a contact of aluminum and halogenated gas at this temperature. However, Patent Article 1 also shows that production of aluminum monohalide gas is not zero and few will be produced, even when temperature is made low. Concrete example using hydrogen chloride gas is shown in FIG. 2 (a relationship graph of equilibrium partial pressure and temperature). Note that, FIG. 2 shows a production of dimer of aluminum trichloride ($Al_2Cl_6$) gas in addition to aluminum monochloride (AlCl) gas and aluminum trichloride ($AlCl_3$) gas. This $Al_2Cl_6$ gas is a dimer of $AlCl_3$ gas; and that its characteristic, i.e. reactive property, a temperature when converting to solid, and etc. is the same with $AlCl_3$ gas. Therefore, in the present invention, dimer gas of aluminum trihalide gas is determined the same with aluminum trihalide gas.

According to the method described in Patent Article 1, temperature of the obtained mixed gas is continuously raised; and that there is no reason to consider adherence of solid aluminum within system. Object of the present invention is to minimize aluminum monohalide gas included in aluminum trihalide gas as much as possible, at a condition to which much aluminum trihalide gas is selectively-produced.

When temperature of aluminum at reaction part 12 is less than 300° C., although production amount of aluminum monohalide gas is few, reaction ratio of halogenated gas becomes small and production amount of aluminum trihalide gas itself tends to be low, which is not preferable. To the contrary, when it exceeds 700° C., production ratio of aluminum monohalide gas increases, which is not preferable. In addition, melting point of aluminum is approximately 660° C. and that when it exceeds 700° C., aluminum tends to become liquid material; and that contact efficiency with halogenated gas will be low, which is not preferable. Considering all above, temperature of aluminum at reaction part 12 is preferably 350° C. or more to 660° C. or less, more preferably, 350° C. or more to less than 600° C.

When halogenated gas supplied from gas supply nozzle 3 contact with aluminum within the above temperature range, a mixed gas comprising aluminum trihalide gas as a main component can be efficiently produced. An amount of aluminum trihalide gas and that of aluminum monohalide gas included in said mixed gas are determined by contact efficiency and reaction temperature of aluminum and halogenated gas, and that they may not be completely limited.

Next, converting step, wherein the mixed gas obtained by the above method is cooled and aluminum monohalide gas included in the mixed gas is converted to a solid substance, is described.

(Converting Step)

A mixed gas including aluminum trihalide gas and aluminum monohalide gas is then transferred to convert part 6 of a device shown in FIG. 1. This transfer can be naturally performed from reaction part 12 to convert part 6 by making carrier gas flow from upstream. The method of the present invention is characterized in that aluminum monohalide gas is made to a solid substance at this convert part 6.

In order to make aluminum monohalide gas included in the mixed gas to a solid substance, a temperature of the mixed gas can be set equal to or higher than a temperature to which solid aluminum trihalide deposit, and lower by 50° C. or more than a temperature to which halogenated gas and aluminum react in the above reaction step. Temperature of the mixed gas at reaction part 12 is the same with said reaction temperature. In the present invention, the mixed gas having such reaction temperature is transferred to convert part 6, and temperature of said mixed gas is set equal to or higher than a temperature to which solid aluminum trihalide deposit and lower by 50° C. or more than the reaction temperature. (Hereinafter, temperature of this convert part 6 is determined as a converting temperature in some cases.)

By setting temperature of the mixed gas to the converting temperature, aluminum monohalide gas becomes a solid substance. This solid substance is conceivable that it is produced by converting aluminum monohalide to solid aluminum.

Taking aluminum monochloride gas as an example, in this reaction,

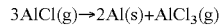

$$3AlCl(g) \rightarrow 2Al(s) + AlCl_3(g)$$

solid deposition such as above may be occurred. In addition, the solid substance is considered that its main component is solid aluminum produced from the above reaction; however, depending on converting temperature and the other conditions, solid aluminum monohalide may be included. Note that analysis of aluminum monohalide is difficult; and that all the solid substances were analyzed as aluminum (solid) in the present examples and the comparative examples.

Temperature regulation of this convert part 6 can be regulated by external temperature regulation means 9. Well-known heating means can be used for this regulation means 9. For instance, materials using resistance heating method, light heating method, high-frequency induction heating method and the like can be used.

Temperature of the mixed gas (converting temperature) at convert part 6 should be a temperature equal to or higher than a temperature to which solid aluminum trihalide deposit and lower by 50° C. or more than reaction temperature, in order to convert aluminum monohalide gas to solid aluminum. In order to increase the converting efficiency from aluminum monohalide gas to a solid substance (solid aluminum), converting temperature is preferably 150° C. or more to 400° C. or less, and particularly preferably 183° C. or more to 350° C. or less, which is a sublimation temperature of aluminum trihalide. Converting temperature is preferable to satisfy the above range. Above all, it is particularly preferable to make the difference of converting temperature and reaction temperature to 100° C. or more to 400° C. or less, in order to efficiently decrease aluminum monohalide gas.

Amount of aluminum monohalide included in the mixed gas can be reduced by converting aluminum monohalide to a solid substance (solid aluminum) at convert part 6. As a result, an amount of aluminum monohalide gas in the gas obtained from convert part 6 is reduced; and that aluminum deposit when transferring can also be reduced. In addition, by setting temperature of mixed gas to converting temperature at convert part 6, aluminum monohalide is considered to be solid aluminum and aluminum trihalide gas as shown in the above solid deposition reaction, and amount of aluminum trihalide gas can be efficiently increased.

Further, it is not particularly limited but filler may be placed at the convert part 6. By placing the filler, gas flow inside the reaction tube can be aligned from upstream to downstream. Materials with less impurity and less reactive with halogenated gas, including silica glass, oxidized aluminum, aluminum and the like, are preferable for the filler. In particular, when solid aluminum is used for the filler and when reaction of halogenated gas and solid aluminum is insufficient at reaction part 12, unreacted halogenated gas may further react with aluminum at convert part 6. In this case, converting temperature is lower than reaction temperature, which makes it possible to produce overwhelmingly amount of aluminum trihalide gas and less amount of aluminum monohalide gas even when halogenated gas and solid aluminum reacts. Accordingly, it is considered that there is a little chance for the aluminum monohalide gas produced at this convert part 6 to provide bad influence. Also, it is obvious that this converting step can be performed even not under a solid aluminum.

The gas is cooled at this convert part 6, and then aluminum trihalide gas is separated at separation part 7. Next, this separation step will be described.

(Separation Step)

The gas cooled at convert part 6 may be transferred to separation part 7 under a flow of halogenated gas of a raw material gas and carrier gas from upstream side. Amount of aluminum monohalide gas is greatly reduced in the gas transferred to this separation part 7, when compared to the mixed gas obtained at reaction part 12.

Separation part 7 may have a structure which prevent a solid substance (solid aluminum) deposited at convert part 6 to flow from upstream side to downstream. Among all, filler 11 is preferably placed at separation part 7 for thinning of the solid substance. This filler is not particularly limited as long as it does not react with aluminum trihalide gas, and solid aluminum, silica glass, oxidized aluminum and the like are exemplified. Among said fillers, solid aluminum or silica glass is preferably used in terms of its purity. Certain aluminum monohalide gas may be included in the gas transferred from convert part 6. And thus, silica glass may be used; and said aluminum monohalide gas is possible to react with the silica glass leading to more decrease of aluminum monohalide gas from the transferring gas. In addition, by placing solid aluminum with high purity, a solid substance can be trapped without providing bad influence to reaction.

Although the filler is suitably determined according to outline of the used device, supplied amount of halogenated gas, and the like, trapping effect of solid aluminum deposit at convert part 7 decreases when it is excessively small or large. As an example, circular cylindrical shaped filler having a diameter of 0.1 mm to 10 mm and a length of 0.1 mm to 10 mm is suitably used. As is obvious, fillers having columnar or the other shape can be used without limitation.

By preveting solid substance (solid aluminum) converted from aluminum monohalide gas to be transferred to downstream side, purified aluminum trihalide gas can be obtained. This aluminum trihalide gas is transferred to exhaust nozzle 7 by carrier gas and is possible to be taken out.

Note that, although convert part 6 and separation part 7 according to the present examples have individual structure, they can be unified; and converting step and separation step are possible to be performed in a unified manner.

According to the present invention, aluminum trihalide gas, wherein aluminum monohalide gas is reduced as much as possible, can be obtained; and that gas temperature after passing separation part 7 can be maintained to a temperature equal to or higher than a temperature to which aluminum trihalide does not deposit. Among all, when it is used for a raw material of manufacturing aluminum based group III nitride single crystal, it is preferable to maintain the temperature at least equal to or higher than the temperature at convert part 6 (converting temperature). When it is maintained equal to or higher than the temperature at convert part 6, solid aluminum does not deposit even when few aluminum monohalide gas is included. Therefore, it is preferably used for a growing raw material of aluminum based group III nitride single crystal, which is a sensitive reaction. In concrete, gas temperature after passing separation part 7 is preferably 150° C. or more, and particularly preferably 200° C. or more. And it is particularly preferable that it is higher than the converting temperature. Although upper limit of this gas temperature is not particularly limited, when general production is considered, it is 1100° C. External heating means can be mounted in order to heat to such temperature.

(Crystal Growth Step)

According to the above method, aluminum trihalide gas wherein content of aluminum monohalide gas is much decreased can be obtained. Thus, the obtained aluminum trihalide gas can be used for various uses. In particular, reaction with silica glass can be prevented due to less aluminum monohalide gas content, and aluminum deposition is less. Thus, it is used for a raw material of HVEP method, which is a sensitive reaction. Namely, it is used for growing aluminum based group III nitride single crystal.

In concrete, the obtained aluminum trihalide gas described above is transferred to trap 15 of the device shown in FIG. 1. Here, aluminum trihalide gas and nitrogen source gas, such as ammonia, are made contact with single crystal substrate of high temperature, and then III nitride is epitaxially grown on the single crystal substrate. Device and its surroundings used for this crystal growth step are not particularly limited; and the devices used in Patent Article 1 or Patent Article 2 may be used.

According to a method of the invention, aluminum based group III nitride single crystal substrate can be obtained by processing a thick-film single crystal obtained on a substrate such as sapphire. Further, by forming multilayered structure aimed at emit and the like using a crystal growth method, such as MOVPE method, MBE method, HVPE method, light emitting source with high efficiency can be obtained.

EXAMPLE

Hereinafter, the present invention will be described in detail using examples and comparative examples referring to the figures; however the present invention is not to be limited thereto.

Example 1

An example generating halide aluminum using reaction tube 2 and external heating means shown in FIG. 1 will be described.

Silica glass made reaction tube 2 having an internal diameter of 40 mm and a length of 500 mm was prepared, and from upstream side, the tube 2 was divided to the first zone (reaction part 12) of 200 mm length, the second zone (convert part 6) of 100 mm length, and the third zone (separation part 7) of 200 mm length. Solid aluminum of 99.9999% purity having 5 mm diameter and 6 mm length was filled in the first and the third zone (Solid aluminum filled in the first zone was a raw material, while that in the third zone is a filler.). In this case, filling rate of solid aluminum with respect to the volume inside the reaction tube 2 was 56% (Filling rate (vol %) of solid aluminum in the first zone and that in the third zone were 56%.).

Heaters (external heating means 5, external temperature regulation means 9 and external heating means 10) of resistance heating method, which correspond to a heating zone length of said three zones, were mounted to exterior portion of reaction tube 2. And the heaters heated inside of reaction tube 2 and solid aluminum 4. The first zone was heated to 500° C. (Reaction temperature was 500° C.), the second zone was heated to 350° C. (Converting temperature was 350° C.), and the thirst zone was heated to 350° C. (Temperature of separation part 7 was 350° C.).

A ratio of the mixed gas including aluminum trichloride gas and aluminum monochloride gas may vary according to its temperature; and that it is difficult to precisely-quantify an amount of aluminum trichloride and that of aluminum monochloride included in the gas emitted from the separation part. Accordingly, in the present example, exhaust nozzle 8 was set at downstream side of reaction tube 2, and aluminum chloride gas generated inside reaction tube 2 was emitted to pipe 13. Pipe 13 was maintained at 200° C., which was lower than the converting temperature and the separation temperature, and effect of decreasing aluminum monochlorid was confirmed.

In concrete, pipe heater 14 (jacket heater) was set to exterior portion of pipe 13 in order to maintain internal temperature of pipe 13 at 200° C., and aluminum chloride trap 15 held at 20° C. was set to downstream of said pipe 13 as a safety measure; and the above gas was made flow for a predetermined time. In case when aluminum monochloride gas remains after separation step, adhesion substance (a solid substance) is produced in pipe 13. In this case, aluminum trichloride does not deposit at 200° C.; and that all the above adhesion substance can be determined aluminum monochloride-derived solid substance, and its amount is conceivable to depend on residual aluminum monochloride gas concentration (They have a positive correlation.). For this reason, a residue amount of adhesion substance (a solid substance) inside pipe 13 was measured, and it was evaluated as an indicator of residual aluminum monochloride gas amount. In addition, gas was made flow in a similar manner except maintaining temperature of pipe 13 at 350° C., the same temperature with converting temperature, adhesion substance could not be found in pipe 13, where it was held at 350° C.

(Production of Aluminum Chloride Gas)

A mixture of 488 sccm hydrogen gas and 12 sccm hydrogen chloride gas (Concentration of the hydrogen chloride gas was 2.4 vol %.) was supplied from gas supply nozzle 3 connected to upper stream part of reaction tube 2. After supplying the mixture for 5 hours, hydrogen chloride gas supply was stopped, and then cooled to a room temperature while supplying only hydrogen gas; and inside of reaction tube 2 was observed. In the first zone (reaction part 12), surfaces of aluminum grains were eroded by a reaction with hydrogen chloride gas. In the second zone (convert part 6), a silver adhesion substance (a solid substance) was confirmed on the inner wall. In the third zone (separation part 7), adhesion substances were confirmed on the alumina grain surfaces; and that the original metal aluminum grain surfaces became lusterless. Based on the above observations, it was considered that, in the first zone (reaction part 12) inside reaction tube 2, hydrogen chloride gas and aluminum are made to react, generating aluminum chloride gas (a mixed gas), and then the generated gas was transported to the second zone (convert part 7) where gas temperature was decreased depositing a solid substance (aluminum). It was also confirmed that, in the third zone (separation part 7), aluminum trichloride gas was separated when the solid aluminum adhered to filler and metal aluminum surface became lusterless.

A solid substance was adhered to inside the pipe 13. Internal temperature of the pipe 13 was cooled to room temperature; and then, elemental analysis of this solid substance was performed by energy dispersive X-ray spectrum. As a result, it was observed aluminum 100 atom % and no chloride component was observed; and it was found to be a metal aluminum. As mentioned above, internal temperature of pipe 13 was maintained at 200° C. while supplying hydrogen chloride gas, and that this solid substance was derived from aluminum monochloride gas included in the gas emitted from separation part 7. Inside the pipe 13 was washed with hydrochloric acid having a concentration of 10 mol/litter, adhered solid substance (a solid aluminum) was collected, and then amount of aluminum component included in a solution was determined with a inductively-coupled plasma emission spectrometry device. As a result, an amount of metal aluminum component deposition in pipe 13 was 0.22 mg.

Note that, a solid substance at convert part 7 has the same color with a solid substance in pipe 13; and considering reaction conditions and the like, they are considered to be the same solid aluminum. Elemental analysis of the solid substance at convert part 7 was performed with energy dispersive X-ray spectrum; and it was determined metal aluminum 100%.

Example 2

Aluminum chloride gas was produced under the same conditions with Example 1, except a temperature of the first zone (reaction part 12) was 500° C., that of the second zone (convert part 6) was 200° C., and that of the third zone (separation part 7) was 350° C. Solid substance (solid aluminum) amount adhered to pipe 13 was determined with the same method with Example 1; and it was 0.15 mg.

Example 3

Aluminum chloride gas was produced under the same conditions with Example 1, except a temperature of the first zone (reaction part 12) was 500° C., that of the second zone (convert part 6) was 150° C., and that of the third zone (separation part 7) was 250° C. Solid substance (solid aluminum) amount adhered to pipe 13 was determined with the same method with Example 1; and it was 0.09 mg.

Example 4

Aluminum chloride gas was produced under the same conditions with Example 1, except a temperature of the first zone (reaction part 12) was 600° C., that of the second zone (convert part 6) was 150° C., and that of the third zone (separation part 7) was 250° C. Silica glass inner wall of the first zone (reaction part 12) was discolored to yellow, due to an increased amount of aluminum monochloride generation. Solid substance adhered to the inner wall of the second zone (convert part 6) was confirmed. In addition, adhesion substance was observed on the filler; and the original metal aluminum grain surfaces were confirmed to become lusterless. Solid substance (solid aluminum) amount adhered to pipe 13 was determined with the same method with Example 1; and it was 0.64 mg.

Example 5

Aluminum chloride gas was produced under the same conditions with Example 1, except a temperature of the first zone (reaction part 12) was 400° C., that of the second zone (convert part 6) was 200° C., and that of the third zone (separation part 7) was 350° C. It was confirmed that silica glass inner wall of reaction tube 2 was not discolored at all zones, from the first zone to the third zone. Solid substance (solid aluminum) amount adhered to pipe 13 was determined with the same method with Example 1; and it was 0.08 mg.

Example 6

Aluminum chloride gas was produced under the same conditions with Example 1, except solid aluminum was placed at the second zone (convert part 6). Solid aluminum placed at the second zone (convert part 6) was the same with the aluminum filled in the first zone (reaction part 12); and their filling rate were also the same. Solid substance (solid aluminum) amount adhered to pipe 13 was determined with the same method with Example 1; and it was 0.21 mg.

Example 7

Aluminum chloride gas was produced under the same conditions with Example 6, except flow volume of hydrogen gas, a carrier gas, was 4988 sccm. Supplied amount of hydrogen chloride gas was 12 sccm; and total flow was 5000 sccm. Solid substance (solid aluminum) amount adhered to pipe 13 was determined with the same method with Example 1; and it was 0.12 mg. After the production, according to observation of reaction tube 12 inner side, aluminum grain surfaces were eroded by a reaction with hydrogen chloride gas at the first zone (reaction part 12); and in addition, aluminum grain surfaces were also eroded by a reaction with hydrogen chloride gas at the second zone (convert part 6). On the other hand, in the third zone (separation part 7), a silver adhesion substance (a solid substance) was confirmed on the inner wall; and in addition, adhesion substances were confirmed on the alumina grain surfaces and the original metal aluminum grain surfaces became lusterless. Total flow of gas was increased 10-fold; accordingly, it was considered that reaction of hydrogen chloride gas and aluminum grains at reaction part 12 was insufficient, unreacted hydrogen chloride gas was transported to convert part 6 and reacted with aluminum grains, and a solid substance deposited from aluminum monochloride at separation part 7.

Comparative Example 1

Aluminum chloride gas was produced under the same conditions with Example 1, except temperatures of the first zone (reaction part 12), the second zone (convert part 6), and the third zone (separation part 7) were all 500° C. Discoloration of silica glass inner wall inside reaction tube 2 was not observed. Filler 11 filled inside the third zone of separation part 7 was metal aluminum maintaining luster on its surface; and no change was observed before and after the production of aluminum chloride gas. Further, solid substance adhered to silica glass inner wall at the second and the third zones could not be found. Solid substance (solid aluminum) amount adhered to pipe 13 was determined with the same method with Example 1; and it was 0.95 mg.

Comparative Example 2

Aluminum chloride gas was produced under the same conditions with Example 1, except temperatures of the first zone (reaction part 12), the second zone (convert part 6), and the third zone (separation part 7) were all 600° C. Silica glass inner walls of the first, the second, and the third zones were discolored to yellow, due to increased amount of aluminum monochloride generation. In addition, no change was observed at inner wall of the second zone, convert part 6, and at filler 11 filled inside the third zone, before and after the aluminum chloride gas production; and no solid substance deposition was observed. Solid substance (solid aluminum) amount adhered to pipe 13 was determined with the same method with Example 1; and it was 9.9 mg.

6 Convert part
7 Separation part
8 Exhaust nozzle
9 External temperature regulation means
10 External heating means
11 Filler
12 Reaction part
13 Pipe
14 Pipe heater
15 Trap

The invention claimed is:

1. A production method of aluminum based group III nitride single crystal, comprising:
   a reaction step, wherein a halogenated gas and an aluminum are made contact at a temperature of 300° C. or more to 700° C. or less, and a mixed gas including an aluminum trihalide gas and an aluminum monohalide gas is produced,
   a converting step, wherein the aluminum monohalide gas in the mixed gas is converted to a solid substance by setting a temperature of the mixed gas equal to or higher than a temperature to which a solid aluminum trihalide deposit, and lower by 50° C. or more than a temperature to which the halogenated gas and the aluminum contact in the reaction step,
   a separation step, wherein the aluminum trihalide gas is taken out by separating the solid substance and the gas, and
   a crystal growth step, wherein the aluminum trihalide gas is used for a raw material of aluminum based group III nitride single crystal without lowering its temperature and keeping the temperature equal to or higher than a temperature of the converting step.

2. The production method of aluminum based group III nitride single crystal as set forth in claim 1, wherein the temperature of the mixed gas in the converting step is set at 150° C. or more to 400° C. or less.

3. The production method of the aluminum based group III nitride single crystal as set forth in claim 1, wherein the reaction step, the converting step, and the separation step are conducted under a flow of a hydrogen gas or an inert gas.

TABLE 1

|  | Flow Volume sccm | Reaction Temperature/° C. | Converting Temperature/° C. | Separation Temperature/° C. | Adherence Amount of Solid Substance in Pipe 13/mg |
|---|---|---|---|---|---|
| Ex. 1 | 500 | 500 | 350 | 350 | 0.22 |
| Ex. 2 | 500 | 500 | 200 | 350 | 0.15 |
| Ex. 3 | 500 | 500 | 150 | 250 | 0.09 |
| Ex. 4 | 500 | 600 | 150 | 250 | 0.64 |
| Ex. 5 | 500 | 400 | 200 | 350 | 0.08 |
| Ex. 6 | 500 | 500 | 350 Aluminum-Filled | 350 | 0.21 |
| Ex. 7 | 5000 | 500 | 350 Aluminum-Filled | 350 | 0.12 |
| Comp. Ex. 1 | 500 | 500 | 500 | 500 | 0.95 |
| Comp. Ex. 2 | 500 | 600 | 600 | 600 | 9.9 |

REFERENCE MARKS

1 Device
2 Reaction tube
3 Gas supply nozzle
4 Raw material placement part
5 External heating means 4. A production method of the aluminum trihalide gas defined in claim 1, wherein hydrogen chloride is used as the halogenated gas.

5. The production method of the aluminum based group III nitride single crystal as set forth in claim 1, wherein the solid substance in the separation step is trapped to a filler and separated.

6. A production method of the aluminum trihalide gas defined in claim 5, wherein the filler is a solid aluminum.

7. The production method of the aluminum based group III nitride single crystal as set forth in claim 1, wherein the aluminum trihalide gas is separated during the separation step at a temperature equal to or higher than a temperature of the convert step.

8. The production method of the aluminum based group III nitride single crystal as set forth in claim 1, wherein the convert step is conducted in the presence of a solid aluminum.

9. A production method of aluminum based group III nitride single crystal, comprising:
- contacting a halogenated gas and an aluminum at a temperature of 300° C. to 700° C., and producing a mixed gas comprising an aluminum trihalide gas and an aluminum monohalide gas;
- converting the aluminum monohalide gas to a solid substance by setting a temperature of the mixed gas equal to or higher than a temperature to which a solid aluminum trihalide deposit, and lower by 50° C. or more than the temperature of said contacting;
- separating the aluminum trihalide gas and the solid substance; and
- growing aluminum based group III nitride single crystal by using the aluminum trihalide gas as a raw material without lowering its temperature and keeping the temperature equal to or higher than the temperature of said converting.

* * * * *